(12) United States Patent
Nakajima et al.

(10) Patent No.: US 6,849,930 B2
(45) Date of Patent: Feb. 1, 2005

(54) SEMICONDUCTOR DEVICE WITH UNEVEN METAL PLATE TO IMPROVE ADHESION TO MOLDING COMPOUND

(75) Inventors: Yoshihiro Nakajima, Tokyo (JP); Akira Fukuizumi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/941,744

(22) Filed: Aug. 30, 2001

(65) Prior Publication Data

US 2002/0047187 A1 Apr. 25, 2002

(30) Foreign Application Priority Data

Aug. 31, 2000 (JP) .......................................... 2000-264083
Jan. 22, 2001 (JP) .......................................... 2001-013869

(51) Int. Cl.[7] ............................................. H01L 23/495
(52) U.S. Cl. ....................... 257/666; 257/675; 257/690; 257/713; 257/696; 257/693; 257/707; 257/784
(58) Field of Search .................................. 257/666, 675, 257/691, 676, 690, 712, 713, 775, 696, 698, 692, 693, 707, 717, 720, 762, 784, 678, 669

(56) References Cited

U.S. PATENT DOCUMENTS

| | | | |
|---|---|---|---|
| 4,862,246 A | | 8/1989 | Masuda et al. |
| 5,252,855 A | | 10/1993 | Ogawa et al. |
| 5,359,872 A | | 11/1994 | Nashiki |
| 5,554,569 A | * | 9/1996 | Ganesan et al. ............... 29/827 |
| 5,724,233 A | * | 3/1998 | Honda et al. ................ 257/668 |
| 5,859,471 A | * | 1/1999 | Kuraishi et al. ............ 257/666 |
| 5,898,575 A | * | 4/1999 | Hawthorne et al. ..... 174/138 G |
| 5,924,190 A | * | 7/1999 | Lee et al. .................... 257/675 |
| 5,929,513 A | * | 7/1999 | Asano et al. ................ 257/675 |
| 6,040,626 A | * | 3/2000 | Cheah et al. ................ 257/341 |
| 6,043,108 A | | 3/2000 | Izumi et al. |
| 6,075,281 A | * | 6/2000 | Liao et al. ................... 257/666 |
| 6,165,819 A | * | 12/2000 | Seki et al. ................... 438/275 |
| 6,222,258 B1 | * | 4/2001 | Asano et al. ................ 257/675 |
| 6,225,742 B1 | * | 5/2001 | Iida et al. .................... 313/317 |
| 6,256,200 B1 | * | 7/2001 | Lam et al. ................... 257/669 |
| 6,291,881 B1 | * | 9/2001 | Yang .......................... 257/723 |
| 6,307,755 B1 | * | 10/2001 | Williams et al. ............ 174/260 |
| 6,319,755 B1 | * | 11/2001 | Mauri ......................... 438/106 |
| 6,338,984 B2 | * | 1/2002 | Minamio et al. ........... 257/666 |

FOREIGN PATENT DOCUMENTS

| | | |
|---|---|---|
| EP | 0 687 008 A2 | 12/1995 |
| JP | 62-36550 U | 3/1987 |

(List continued on next page.)

OTHER PUBLICATIONS

Bindra, Ashok, "Innovative Packages Maximize MOSFETs' Thermal Performance," *Electronic Design*, Penton Publishing, Cleveland, OH, U.S, vol. 47, No. 10, May 17, 1999.

*Primary Examiner*—Nathan J. Flynn
*Assistant Examiner*—Pershelle Greene
(74) *Attorney, Agent, or Firm*—Sughrue Mion, PLLC

(57) ABSTRACT

The present invention provides a semiconductor device whose reliability is improved by improving the adhesion strength of a metal plate or connecting chip, said plurality of electrodes and a lead frame with a molding resin. Further, the semiconductor device of the present invention prevents flow out of a conductive joining material to be employed for joining a lead terminal and the metal plate other than the joining range of the metal plate and the lead terminal, and mounts the metal plate at high precision. In a semiconductor device (a plastic package) in which a source electrode of a semiconductor chip and source terminal of a lead frame are electrically connected by a copper plate and sealed by a resin, the surface of the copper plate is roughened to improve the adhesion strength to a molding resin. Further, a stepped part is formed in the source terminal to prevent a conductive paste from flowing out. The structure is so formed as to fit claw parts in the lead frame.

13 Claims, 11 Drawing Sheets

FOREIGN PATENT DOCUMENTS

| | | |
|---|---|---|
| JP | 02-121356 A | 5/1990 |
| JP | 03-151648 A | 6/1991 |
| JP | 04-15248 U | 2/1992 |
| JP | 4-328839 A | 11/1992 |
| JP | H4-328839 | 11/1992 |
| JP | 05-166871 A | 7/1993 |
| JP | 06-85133 A | 3/1994 |
| JP | 07-326698 A | 12/1995 |
| JP | 8-148623 | 6/1996 |
| JP | 10-4166 A | 1/1998 |
| JP | 11-150286 A | 6/1999 |
| JP | 2000-156708 | 5/2000 |
| JP | 2000-183249 A | 6/2000 |
| JP | 2001-339028 A | 12/2001 |

* cited by examiner

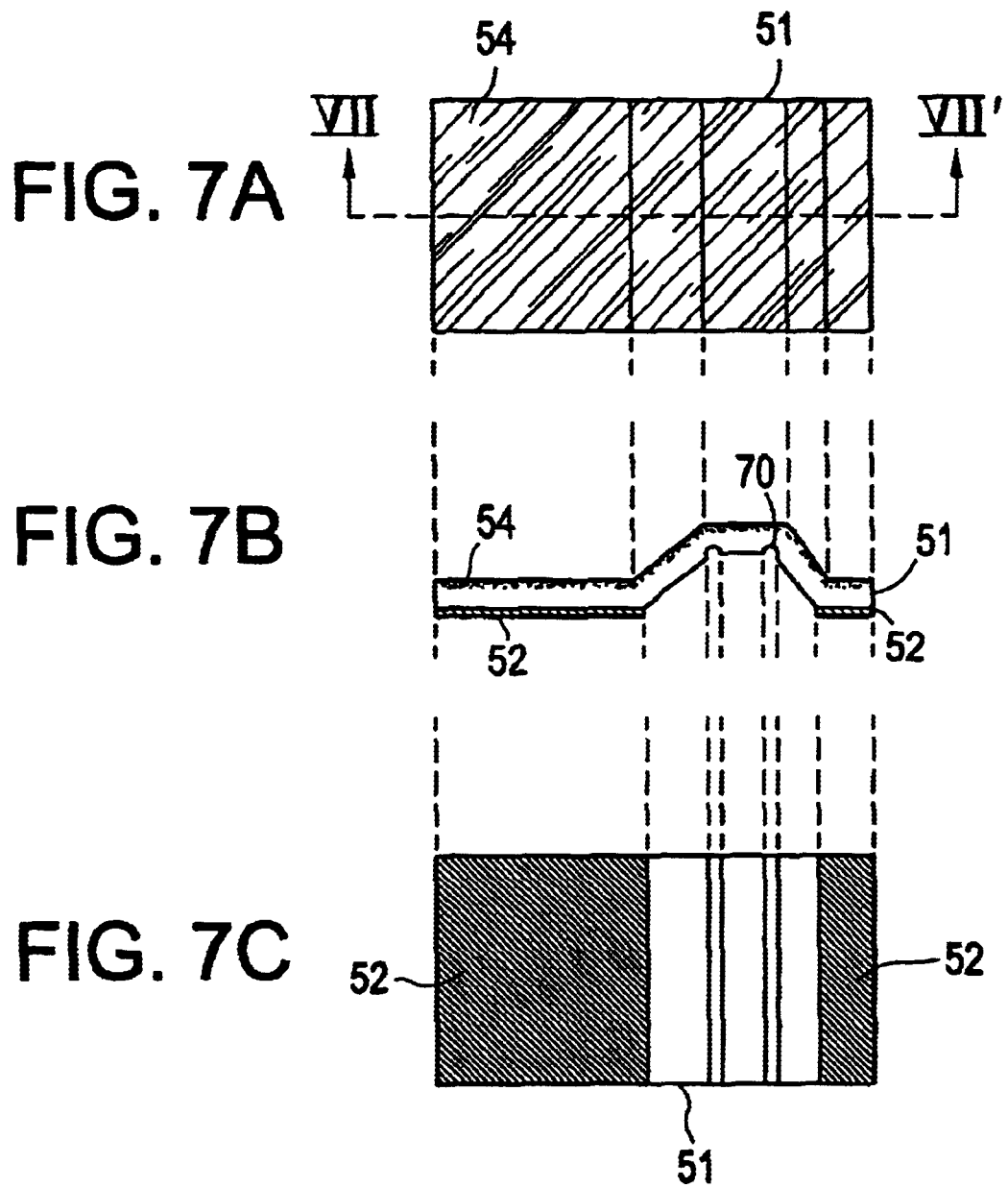

SEMICONDUCTOR DEVICE WITH UNEVEN METAL PLATE TO IMPROVE ADHESION TO MOLDING COMPOUND

BACKGROUND OF THE INVENTION

1. Field of the Invention

The present invention relates to a semiconductor device sealed with a resin, that is, a plastic package, and more particularly to a plastic package of which electrodes of a semiconductor chip and lead terminals are electrically connected to each other by a metal plate such as copper. The present application is based on Japanese Patent Application No. 264083/2000 and Japanese Patent Application No. 013869/2001, the disclosures of which are incorporated herein by reference.

2. Description of the Related Art

A semiconductor device sealed with a resin, that is, a plastic package, comprises a semiconductor chip (also called a pellet or a die), wiring materials forming outer terminals such as a lead frame, and a molding resin for sealing the semiconductor chip bonded to the wiring materials and inner leads.

Examples of the wiring materials are a tape carrier (a film carrier), a printed circuit plate, and the like other than a lead frame. As the molding resin, an epoxy resin is mainly used.

A wire bonding method has conventionally been employed in many cases as a method for electrically connecting electrodes of a semiconductor chip and lead terminals of wiring materials. FIGS. 1A and 1B are illustrations showing one example of a conventional semiconductor device 1 employing wire bonding method. FIG. 1A is a plane view and FIG. 1B is a cross-section cut along the line I–I' of FIG. 1A.

As shown in FIGS. 1A and 1B, the semiconductor device 1 is an 8-pin SOP (Small Outline Package) produced by mounting and bonding a semiconductor chip 10 comprising a MOSFET on and with a lead frame 20, forming an electrical connection by a bonding wire 7, and sealing with a molding resin 8. The semiconductor chip 10 comprises a gate electrode 11 and three source electrodes 12 on the upper face and a drain electrode (not shown in the illustrations) on the bottom face. The lead frame 20 is provided with leads projected from opposite sides in the package; four drain leads 21 on the left side of FIG. 1A and one gate lead 22 and three source leads 23 on the right side of FIG. 1A. The drain leads 21 are integrally formed in the inside of the package and due to that, an island part 24 is formed. The gate lead 22 has an inner lead terminal part 25 (hereinafter referred to as a gate terminal) in the inside of the package. Each of three source leads 23 has an inner lead terminal part 26 (hereinafter referred to as a source terminal) in the inside of the package. The semiconductor chip 10 is bonded to the island part 24 through a die bond material 9 and the drain electrode (not shown in the illustrations) is electrically connected with the island part 24. The gate electrode 11 on the upper face of the semiconductor chip 10 and the gate terminal 25 of the lead frame 20 are connected with each other by the bonding wire 7. Also, the source electrodes 12 and the source terminals 26 of the lead frame 20 are connected with each other by the bonding wire 7. The semiconductor chip 10, inner leads (including the island part 24, the gate terminal 25, and the source terminals 26), and the bonding wire 7 are sealed with a molding resin 8 to form a package.

The above described semiconductor device 1 is an example of a power transistor for high electric current use and in order to lower the resistance, source electrodes 12 and the gate terminal 25 are connected with the bonding wire 7 of a gold wire or the like as much as possible.

However, by the wire bonding method using a costly thin metal wire such as a gold wire or the like, problems are caused. Not only is the fabrication cost considerably increased but also disconnection takes place in the thin metal wire to make the package unsuitable for high electric current use. Recently, a method for forming an electrical connection using a metal plate such as copper has been proposed (Japanese Laid-Open Patent Application Heisei 8-148623) in a power transistor for high electric current use. As compared with a metal wire, the metal plate has advantages such as decrease of the resistance and improvement of heat radiation since the cross-sectional surface area can be widened.

However, in a plastic package in which electrodes of a semiconductor chip and the lead terminals of wiring materials are electrically connected by a metal plate, there exist the following problems.

At first, description will be given regarding an application example of a plastic package in which electrodes of a semiconductor chip and lead terminals of wiring materials are electrically connected with a metal plate. FIGS. 2A and 2B are illustrations of a semiconductor device 2 using a metal plate for connection. FIG. 2A is a plane view and FIG. 2B is a cross-section cut along the line II–II' in FIG. 2A.

As shown in FIGS. 2A and 2B, the semiconductor device 2 is an 8-pin SOP produced by mounting and bonding a semiconductor chip 30 comprising a MOSFET on and with a lead frame 40, forming an electrical connection by a bonding wire 7 and a metal plate 50 of such as a copper plate, and sealing by a molding resin 8. The semiconductor chip 30 comprises a gate electrode 31 and a single source electrode 32 with a large surface area on the upper face and a drain electrode (not shown in the illustrations) on the bottom face. The lead frame 40 is provided with leads projected from opposite sides of the package; four drain leads 41 on the left side of FIG. 2A and one gate lead 42 and three source leads 43 on the right side of FIG. 2A. The drain leads 41 are integrally formed in the inside of the package and due to that, an island part 44 is formed. The gate lead 42 has an inner lead terminal part 45 in the inside of the package. The three source leads 43 are integrally formed in the inside of the package and have a single wide width source terminal 46. The semiconductor chip 30 is bonded to the island part 44 through a die bond material 9 and the drain electrode (not shown in the illustrations) is electrically connected with the island part 44. The gate electrode 31 on the upper face of the semiconductor chip 30 and the gate terminal 45 of the lead frame 40 are connected with each other by the bonding wire 7. Also, the source electrode 32 and the source terminal 46 of the lead frame 40 are connected with each other by the metal plate 50 of copper. The metal plate 50 is bonded to the source electrode 32 in one end and to the source terminal 46 in the other end by a conductive paste 6 to electrically connect the source electrode 32 and the source terminal 46. The semiconductor chip 30, inner leads (including the island part 44, the gate terminal 45, and the source terminal 46), the bonding wire 7, and the metal plate 50 are sealed with a molding resin 8 to form a package.

As shown in FIG. 2A, the metal plate 50 is formed to have about a half width of the external size of the package and the cross-section surface area is extremely widened as compared with that of a gold wire. Consequently, the resistance of the package is lowered.

A semiconductor device is to be exposed to severe environments in which the temperature, the humidity, and the pressure are fluctuated at the time of being mounted and used after the packaging. Because the semiconductor device is repeatedly subjected to temperature alteration, the bonding of the metal plate and the molding resin ocassionally becomes broken, causing separation of the metal plate from the resin. Then, water and a corrosive gas may penetrate the semiconductor chip through the parted interfaces to cause corrosion of the semiconductor chip. As a result, the reliability of the semiconductor device is lowered.

In the case of using a metal wiring, even if such separation from the molding resin occurs, since the cross-sectional surface area of a gold wire is small, the penetration route of the water and a gas is relatively narrow and therefore, water and the gas scarcely penetrate the semiconductor chip through the interface between the metal wire and the molding resin. This mitigates the extent that the reliability of the semiconductor device is deteriorated.

However, since the cross-sectional surface area of the metal plate is large as compared with that of the metal wire and further the cross-sectional surface area is intentionally widened based on the requirement of decrease of the resistance and improvement of heat radiation, the contact surface area with the molding resin is naturally widened and the penetration route of water and the gas becomes wide. This adversely affects the reliability of the semiconductor device, as it is deteriorated by the water and gas penetration.

Further, although in some cases, a solder paste and a resin type conductive paste are used for bonding the lead terminals and the metal plate, the solder paste and the conductive paste sometimes flow out of the bonding range of the metal plate and the lead terminals. In the case where the solder paste and the conductive paste flow from the lead terminals in the extended direction of the leads and are spread from the lead terminals to the package outer circumference position and to the peripheral part of the package outer circumference, the conductive paste and the like decrease the adhesion strength of the molding resin and cause the separation of the molding resin. As a result, water and the gas may easily penetrate the semiconductor chip from the outside and cause corrosion of the semiconductor chip, resulting in reduced reliability of the semiconductor device.

On the other hand, it is desired to mount a metal plate on electrodes and lead terminals of the semiconductor chip at a high precision.

The present invention has been developed while taking the above described conventional techniques into consideration. Regarding a semiconductor device (a plastic package) in which electrodes of a semiconductor chip and lead terminals are electrically connected with a metal plate, such as copper, and which is sealed with a resin, the present invention improves the sealing property of the molding resin and improves the reliability of the semiconductor device by improving the adhesion property between the metal plate and the molding resin.

Further, the present invention improves the adhesion property between the leads and the sealing resin and sealing property of the molding resin and improves the reliability of the semiconductor device by preventing a conductive bonding material employed for bonding the lead terminals and the metal plate from being spread to the outside of the bonding range between the metal plate and the lead terminals, particularly to the outside of the package on the leads.

Furthermore, the present invention provides a semiconductor device in which a metal plate is easily and highly precisely mounted on electrodes of a semiconductor chip and the lead terminals of a lead frame.

SUMMARY OF THE INVENTION

A first embodiment of the present invention to achieve the foregoing objects is a semiconductor device including: a semiconductor chip having electrodes; wiring materials having lead terminals; a metal plate electrically connecting electrodes and lead terminals; and a molding resin for sealing the semiconductor chip, parts of the wiring materials, and the metal plate, characterized in that the surface of the metal plate is roughened and joined to the molding resin.

By composing such a constitution, since the surface of the metal plate is roughened, the adhesion strength between the metal plate and the molding resin is improved and the closed property (sealed property) provided by the molding resin is improved and the reliability of the semiconductor device is improved.

Another embodiment of the present invention is a semiconductor device including: a semiconductor chip having electrodes; wiring materials having lead terminals; a metal plate electrically connecting electrodes and lead terminals; and a molding resin for sealing the semiconductor chip, parts of the wiring materials, and the metal plate, characterized in that the surface of the metal plate is dimpled and joined to the molding resin.

By composing such a constitution, since the surface of the metal plate is dimpled, the adhesion strength between the metal plate and the molding resin is improved and the closed property (sealed property) provided by the molding resin is improved and the reliability of the semiconductor device is improved.

Further, an additional feature of an embodiment of the present invention is the semiconductor device characterized in that the metal plate is bonded to the electrodes and the lead terminals through partial plating formed on the metal plate and the molding resin is bonded to the material of the metal plate.

By composing such a constitution, conductive bonding material to be employed for bonding the lead terminals and the metal plate is prevented from flowing out of the package on the leads and the adhesion strength between the leads and the molding resin is improved and the closed property (sealed property) provided by the molding resin is improved and the reliability of the semiconductor device is improved.

Further, another embodiment of the present invention is a semiconductor device including: a semiconductor chip having electrodes; a lead frame having lead terminals; a metal plate electrically connecting electrodes and lead terminals; and a molding resin for sealing the semiconductor chip, parts of the wiring materials, and the metal plate, characterized in that the lead terminals have a stepped part as to form a concave shape toward the metal plate side and the lead terminals and the metal plate are joined through a conductive bonding material applied to the stepped part.

By composing such a constitution, the conductive bonding material is prevented from flowing out of the package on the leads and being spread and the adhesion strength between the leads and the molding resin is improved and the closed property (sealed property) provided by the molding resin is improved and the reliability of the semiconductor device is improved.

Further, another embodiment of the present invention is a semiconductor device including: a semiconductor chip having electrodes; a lead frame having lead terminals; a metal plate electrically connecting electrodes and lead terminals; and a molding resin for sealing the semiconductor chip, parts of the wiring materials, and the metal plate, characterized in that claw parts formed in the metal plate are fitted in the lead frame.

By composing such a constitution, since the surface of the metal plate has claw parts, it is possible to position the metal plate having the claw parts relative to the lead frame. Therefore, the semiconductor device can be easily manufactured with high precision.

Further, another embodiment of the present invention is a semiconductor device including: a semiconductor chip having electrodes; wiring materials having lead terminals; a metal plate electrically connecting electrodes and lead terminals; and a molding resin for sealing the semiconductor chip, parts of the wiring materials, and the metal plate, characterized in that the roughened surface of the metal plate is joined to the molding resin: the metal plate has at least one bent part between the electrodes and the lead terminals: the metal plate is bonded to the electrodes and the lead terminals through the partial silver plating formed on the metal plate: and that the partial plating is carried out only in the bonding parts of the metal plate to the electrodes and the lead terminals.

By composing such a constitution, since the surface of the metal plate is roughened, the adhesion strength between the metal plate and the molding resin is improved and the closed property (sealed property) provided by the molding resin is improved and the reliability of the semiconductor device is improved. Also, since the metal plate is bonded to the electrodes and the lead terminals through the partial plating, the metal plate is prevented from oxidation and the contact resistance between the electrodes and the lead terminals can be lowered.

Further, another embodiment of the present invention is a semiconductor device including: a semiconductor chip having electrodes; wiring materials having lead terminals; a metal plate electrically connecting electrodes and lead terminals; and a molding resin for sealing the semiconductor chip, parts of the wiring materials, and the metal plate, characterized in that the dimpled surface of the metal plate is joined to the molding resin, the metal plate has at least one bent part between the electrodes and the lead terminals, the metal plate is bonded to the electrodes and the lead terminals through the partial silver plating formed on the metal plate, and the partial plating is carried out only in the bonding parts of the metal plate to the electrodes and the lead terminals.

By composing such a constitution, since the surface of the metal plate is dimpled, the adhesion strength between the metal plate and the molding resin is improved and the closed property (sealed property) provided by the molding resin is improved and the reliability of the semiconductor device is improved. Also, since the metal plate is bonded to the electrodes and the lead terminals through the partial silver plating, the metal plate is prevented from oxidation and the contact resistance between the electrodes and the lead terminals can be lowered.

Further, another embodiment of the present invention is a semiconductor device including: a semiconductor chip having electrodes; wiring materials having lead terminals; a metal plate electrically connecting electrodes and lead terminals; and a molding resin for sealing the semiconductor chip, parts of the wiring materials, and the metal plate, characterized in that the roughened surface of the metal plate is joined to the molding resin, the metal plate has at least one bent part between the electrodes and the lead terminals, the metal plate is bonded to the electrodes and the lead terminals through the partial plating formed on the metal plate, and no plating is carried out on the parts of the metal plate to which the electrodes and the led terminals are not bonded.

By composing such a constitution, since the surface of the metal plate is roughened, the adhesion strength between the metal plate and the molding resin is improved and the closed property (sealed property) provided by the molding resin is improved and the reliability of the semiconductor device is improved. Also, since the metal plate is bonded to the electrodes and the lead terminals through the partial plating, the metal plate is prevented from oxidation and the contact resistance between the electrodes and the lead terminals can be lowered.

Further, another embodiment of the present invention is a semiconductor device including: a semiconductor chip having electrodes; wiring materials having lead terminals; a metal plate electrically connecting electrodes and lead terminals; and a molding resin for sealing the semiconductor chip, parts of the wiring materials, and the metal plate, characterized in that the dimpled surface of the metal plate is joined to the molding resin, the metal plate has at least one bent part between the electrodes and the lead terminals, the metal plate is bonded to the electrodes and the lead terminals through the partial silver plating formed on the metal plate, and no plating is carried out on the parts of the metal plate to which the electrodes and the led terminals are not bonded.

By composing such a constitution, since the surface of the metal plate is dimpled, the adhesion strength between the metal plate and the molding resin is improved and the closed property (sealed property) provided by the molding resin is improved and the reliability of the semiconductor device is improved. Also, since the metal plate is bonded to the electrodes and the lead terminals through the partial silver plating, the metal plate is prevented from oxidation and the contact resistance between the electrodes and the lead terminals can be lowered.

Further, another feature of a preferred embodiment of the present invention is the semiconductor device characterized in that the lead terminals have a stepped part as to form a concave shape toward the metal plate side and the lead terminals and the metal plate are joined through a conductive bonding material applied to the stepped part.

By composing such a constitution, the conductive bonding material is prevented from flowing out on the leads and being spread and the adhesion strength between the leads and the molding resin is improved and the closed property (sealed property) provided by the molding resin is improved and the reliability of the semiconductor device is improved.

Further, another feature of a preferred embodiment of the present invention is the semiconductor device characterized in that the claw parts formed in the metal plate are fitted in the lead frame.

By composing such a constitution, since the surface of the metal plate has claw parts, it is possible to position the metal plate having the claw parts relative to the lead frame. Therefore, the semiconductor device can be easily manufactured with high precision.

Further, another feature of a preferred embodiment of the present invention is the semiconductor device characterized in that the groove parts are formed in the bent part of the metal plate in the direction crossing the extended direction of the lead terminals.

By composing such a constitution, the metal plate is made easy to be bent at the time of semiconductor device fabrication and as a result, it makes semiconductor device fabrication easy. Additionally, even if the conductive bonding material flows on the leads, the flow of the material is stopped by the groove parts. As a result, the adhesion strength between the metal plate and the molding resin is further improved and the closed property (sealed property) provided by the molding resin is further improved.

Further, another feature of an embodiment of the present invention is the semiconductor device characterized in that the groove parts are formed in the concave face side of the bent part of the metal plate.

By composing such a constitution, the metal plate is made easy to be bent at the time of semiconductor device fabrication and the closed property (sealed property) provided by the molding resin is further improved.

Further, another feature of an embodiment of the present invention is the semiconductor device characterized in that parts of the lead terminals bonded to the metal plate are partially plated.

By composing such a constitution, the oxidation preventive effect of the metal plate is further improved.

Further, another embodiment of the present invention is a semiconductor device including: a semiconductor chip having electrodes; wiring materials having lead terminals; a metal plate electrically connecting electrodes and lead terminals; and a molding resin for sealing the semiconductor chip, parts of the wiring materials, and the metal plate, characterized in that the surface of the metal plate is roughened and joined to the molding resin and that groove parts are formed in the lead terminals in the direction crossing the extended direction of the lead terminals themselves.

By composing such a constitution, since the surface of the metal plate is roughened, the adhesion strength between the metal plate and the molding resin is improved and the closed property (sealed property) provided by the molding resin is improved and the reliability of the semiconductor device is improved. Also, since groove parts are formed, even if the conductive bonding material flows on the leads, the flow of the material is stopped by the groove parts and as a result, the adhesion strength between the molding resin and the leads is not deteriorated and the reliability of the semiconductor device is improved.

Further, another the other embodiment of the present invention is a semiconductor device including: a semiconductor chip having electrodes; wiring materials having lead terminals; a metal plate electrically connecting electrodes and lead terminals; and a molding resin for sealing the semiconductor chip, parts of the wiring materials, and the metal plate, characterized in that the surface of the metal plate is dimpled and joined to the molding resin and that groove parts are formed in the lead terminals in the direction crossing the extended direction of the lead terminals themselves.

By composing such a constitution, since the surface of the metal plate is dimpled, the adhesion strength between the metal plate and the molding resin is improved and the closed property (sealed property) provided by the molding resin is improved and the reliability of the semiconductor device is improved. Also, since groove parts are formed, even if the conductive bonding material flows on the leads, the flow of the material is stopped by the groove parts and as a result, the adhesion strength between the molding resin and the leads is not deteriorated and the reliability of the semiconductor device is improved.

Further, another feature of an embodiment of the present invention is the semiconductor device characterized in that the metal plate has at least one bent part between the electrodes and the lead terminals and the metal plate is bonded to the electrodes and the lead terminals through partial plating formed on the metal plate and that the partial silver plating is carried out only on the bonding parts of the metal plate to the electrodes and the lead terminals.

By composing such a constitution, since the surface of the metal plate is dimpled, the adhesion strength between the metal plate and the molding resin is improved and the closed property (sealed property) provided by the molding resin is improved and the reliability of the semiconductor device is improved. Also, since the metal plate is bonded to the electrodes and the lead terminals through the partial silver plating, the metal plate is prevented from oxidation and the contact resistance between the electrodes and the lead terminals can be lowered.

Further, another feature of an embodiment of the present invention is the semiconductor device characterized in that the metal plate has at least one bent part between the electrodes and the lead terminals and the metal plate is bonded to the electrodes and the lead terminals through partial silver plating formed on the metal plate and that no plating is carried on the parts of the metal plate to which the electrodes and the lead terminals are not bonded.

By composing such a constitution, since the surface of the metal plate is dimpled, the adhesion strength between the metal plate and the molding resin is improved and the closed property (sealed property) provided by the molding resin is improved and the reliability of the semiconductor device is improved. Also, since the metal plate is bonded to the electrodes and the lead terminals through the partial silver plating, the metal plate is prevented from oxidation and the contact resistance between the electrodes and the lead terminals can be lowered.

Further, another feature of an embodiment of the present invention is the semiconductor device characterized in that the lead terminals have a stepped part as to be concave toward the metal plate and the lead terminals and the metal plate are bonded through a conductive bonding material applied to the stepped part.

By composing such a constitution, the conductive bonding material is prevented from flowing out on the leads and being spread and the adhesion strength between the leads and the molding resin is improved and the closed property (sealed property) provided by the molding resin is improved and the reliability of the semiconductor device is improved.

Further, another feature of an embodiment of the present invention is the semiconductor device characterized in that claw parts formed in the metal plate are fitted in the lead frame.

By composing such a constitution, high precision manufacturing of the semiconductor device is possible.

Further, another feature of embodiment of the present invention is the semiconductor device characterized in the groove parts are formed in the bottom face side of the bent part of the metal plate in the direction vertical to the extended direction of the lead terminals.

By composing such a constitution, even if the conductive bonding material flows out on the leads, the flow of the material is stopped by the groove parts and as a result, the adhesion strength between the molding resin and the leads is not deteriorated and the reliability of the semiconductor device is improved.

Further, another feature of embodiment of the present invention is the semiconductor device characterized in that lead terminals are partially plated in the parts bonded to the metal plate.

By composing such a constitution, the oxidation preventive effect of the metal plate is further improved.

BRIEF DESCRIPTION OF THE DRAWINGS

The above and other objects, advantages and features of the present invention will be more apparent from the following description taken in conjunction with the accompanying drawings, in which:

FIG. 1A is a plane view and FIG. 1B is a cross-section cut along the line I–I' of FIG. 1A;

FIG. 2A is a plane view and FIG. 2B is a cross-section cut along the line II–II' of FIG. 2A;

FIG. 3A is a plane view and FIG. 3B is a cross-section cut along the line III–III' of FIG. 3A;

FIG. 4A is a plane view, FIG. 4B is a cross-section cut along the line IV–IV' of FIG. 4A, and FIG. 4C is a bottom face of FIG. 4B;

FIG. 5A is a plane view, FIG. 5B is a cross-section cut along the line V–V' of FIG. 5A, and FIG. 5C is a bottom face of FIG. 5B;

FIG. 6A is a plane view, FIG. 6B is a cross-section cut along the line VI–VI' of FIG. 6A, and FIG. 6C is a bottom face of FIG. 6B;

FIGS. 7A to 7C are illustrations showing the copper plate 51 (example 4) to be employed for the semiconductor device 3 of the embodiment 1 of the present invention. FIG. 7A is a plane view, FIG. 7B is a cross-section cut along the line VII–VII' of FIG. 7A, and FIG. 7C is a bottom face FIG. 7B;

FIG. 8A is a plane view and FIG. 8B is a side view;

FIG. 9A is a plane view and FIG. 9B is a cross-section cut along the line VIII–VIII' of FIG. 9A;

FIG. 10A is a plane view, FIG. 10B is a cross-section cut along the line IX–IX' of FIG. 10A, FIG. 10C is a bottom face of FIG. 10B, and FIG. 10D is a cross-section cut along the line X–X' of FIG. 10A; FIG. 11A is a plane view, FIG. 11B is a cross-section cut along the line XI–XI' of FIG. 11A, and FIG. 11C is a bottom face of FIG. 11B.

BRIEF DESCRIPTION OF THE INVENTION

Preferred embodiments of a semiconductor device of the present invention will be described with reference to attached figures. Incidentally, the following descriptions are for preferred embodiments and do not restrict the present invention in any sense.

EMBODIMENT 1

Figure 1A:
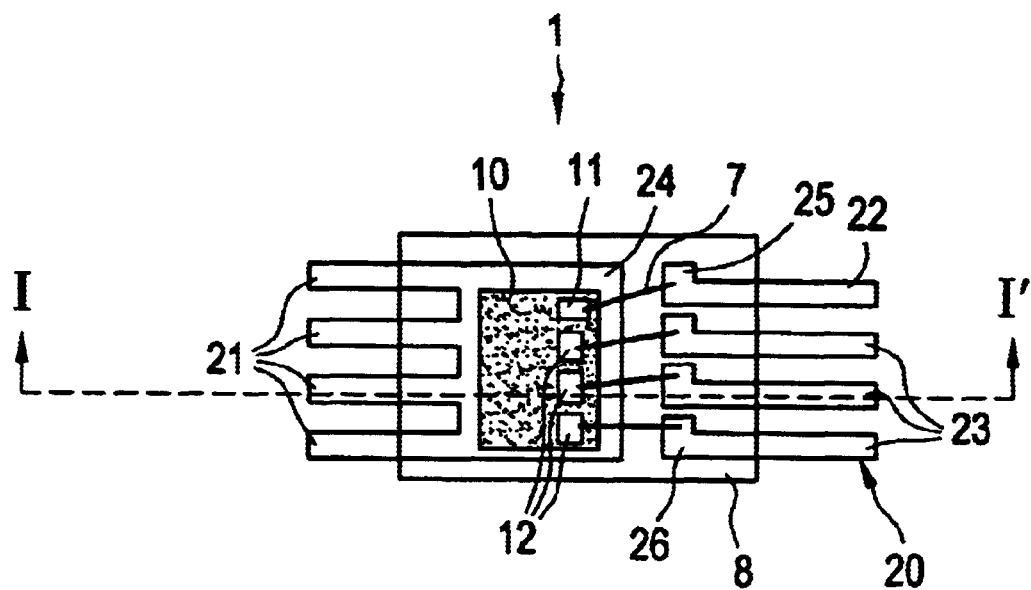
FIGS. 1A and 1B are illustrations showing one example of a conventional semiconductor device 1 employing a wire bonding method.
Figure 1B:
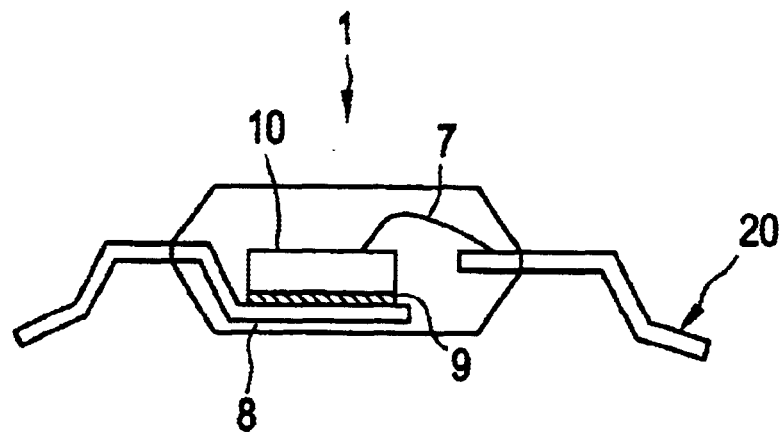
Figure 2A:
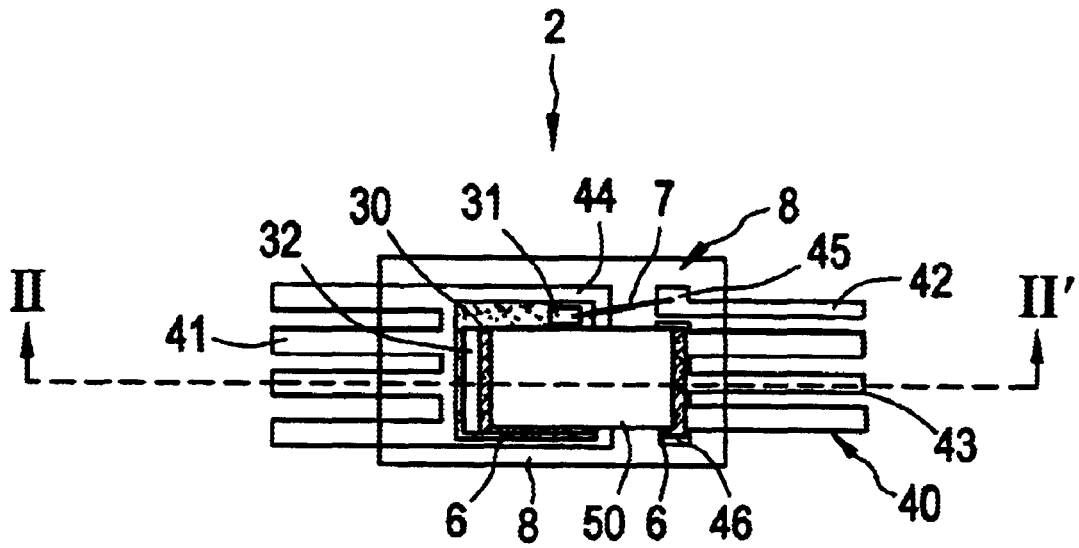
FIGS. 2A and 2B are illustrations showing a semiconductor device 2 employing a metal plate for connection.
Figure 2B:
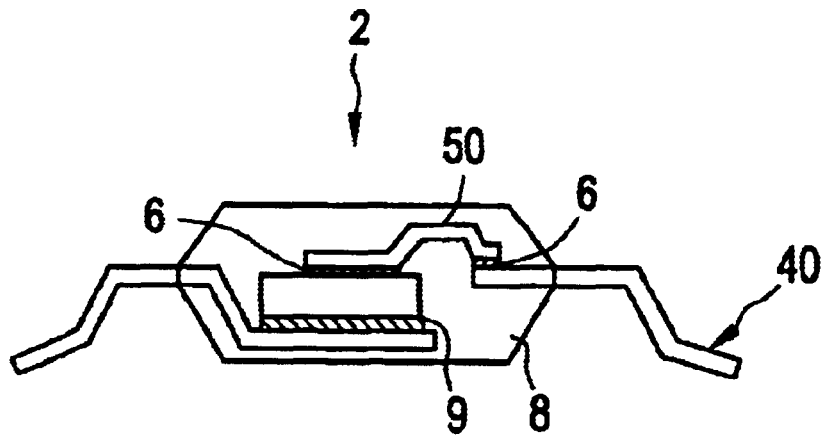
Figure 3A:
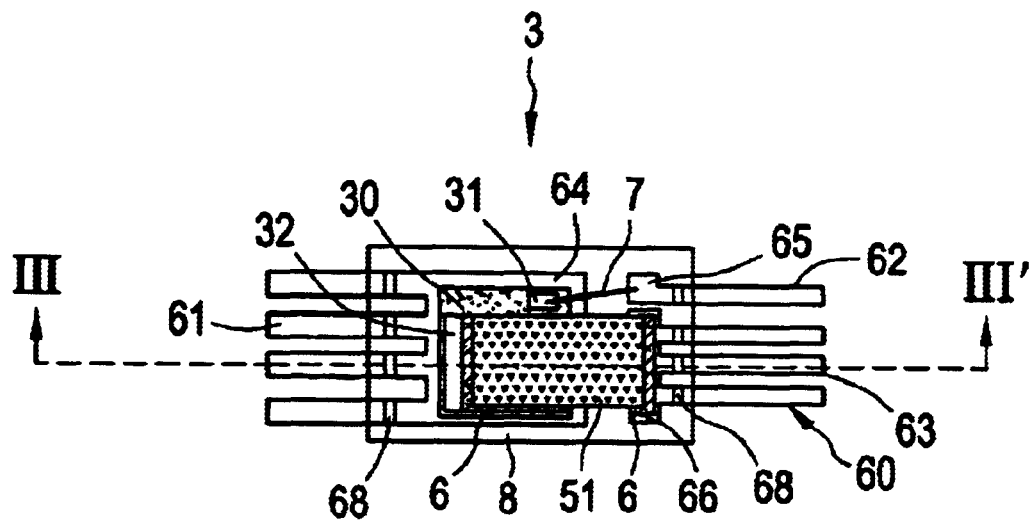
FIGS. 3A and 3B are illustrations showing the semiconductor device 3 of the embodiment 1 of the present invention.
Figure 3B:
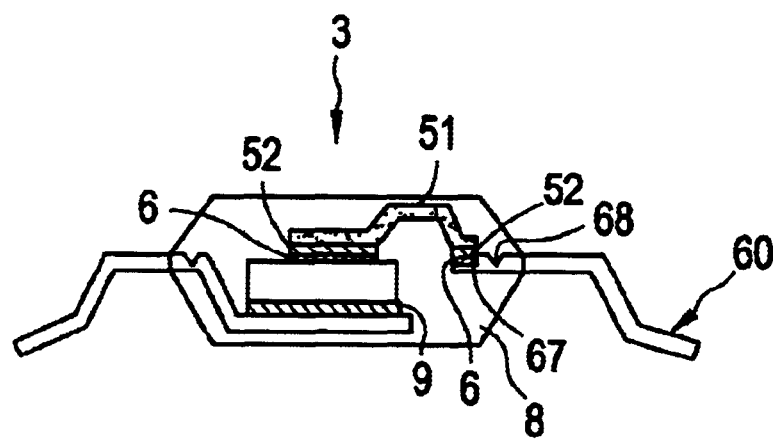

At first, a semiconductor device 3 of the embodiment 1 of the present invention will be described with reference to FIGS. 3A and 3B. FIGS. 3A and 3B are illustrations showing the semiconductor device of the embodiment 1 of the present invention. FIG. 3A is a plane view and FIG. 3B is a cross-section cut along the III–III' line in FIG. 3A.

As shown in FIGS. 3A and 3B, the semiconductor device 3 is an 8-pin SOP produced by mounting and bonding a semiconductor chip 30 composing a MOSFET on and with a lead frame 60, forming an electrical connection by a bonding wire 7, such as a gold wire, and a copper plate 51, and sealing by a molding resin 8 of such as an epoxy resin or the like. The semiconductor chip 30 comprises a gate electrode 31 and a single source electrode 32 with a large surface area on the upper face and a drain electrode (not shown in the illustrations) in the bottom face. These electrodes are aluminum or aluminum alloy electrodes, gold electrodes, or electrodes plated by gold plating, silver plating or the like. The lead frame 60 is provided with leads projected from opposite sides of the package; four drain leads 61 in the left side of FIG. 3A and one gate lead 62 and three source leads 63 in the right side of FIG. 3A. The drain leads 61 are integrally formed in the inside of the package and due to that, an island part 64 is formed. The gate lead 62 has a gate terminal 65 in the inside of the package. The three source leads 63 are integrated in the inside of the package and have an integrated single and wide source terminal 66. The semiconductor chip 30 is bonded to the island part 64 by a die bonding material 9 and a drain electrode (not shown in the illustrations) is electrically connected to the island part 64. Incidentally, the mounting region in the island part 64 of the semiconductor chip 30 may be plated with silver. The gate electrode 31 on the upper face of the semiconductor chip 30 and the gate terminal 65 of the lead frame 60 are connected by the bonding wire 7. The source electrode 32 and the source terminal 66 of the lead frame 60 are connected with the copper plate 51. The copper plate 51 is joined to the source electrode 32 in one end by a conductive paste 6 and joined to the source terminal 66 in the other end by the conductive paste 6 to electrically connect the source electrode 32 and the source terminal 66 by the copper plate 51. The semiconductor chip 30, inner leads (including the island part 64, the gate terminal 65, and the source terminal 66), the bonding wire 7, and the copper plate 51 are sealed with a molding resin 8 to form a package. The lead parts (outer leads) exposed out the molding resin 8 compose outer terminals.

The conductive paste is an adhesive containing a resin such as an epoxy resin, acrylic resin, and the like as a main agent and mixed with a curing agent and a conductive material of such as a silver powder. Although a solder paste may be used instead of a conductive paste, a conductive paste with a low elasticity is preferable to be used in order to moderate the thermal stress attributed to the difference of thermal expansion coefficients.

The copper plate 51 is made of a copper alloy. Although a metal plate of such as a Fe-Ni 42 alloy or the like may be used instead of the copper plate, a copper plate of a Cu alloy should be selected in the case where heat releasing property is required.

The copper plate 51 is a band-like thin plate having a width about a half of the outer size of the package as shown in FIG. 3A and the copper plate is so formed as to be flat in the joining face to the source electrode 32 and the joining face to the source terminal 66 and as to have two bent parts between the joining face to source electrode 32 and the source terminal 66 as shown in FIG. 3B. The copper plate 51 may be formed by pressing.

The copper plate 51 is surface-roughened in the upper face (the opposed face to the face which is to be joined to the source electrode and the source terminal) and partially plated with silver plating 52 in the bottom face.

In this case, surface roughening includes both micro-roughening (forming a roughened face at a micro level) and macro-roughening (forming a roughened face at a macro level). This is because not only roughening at a micro level but also roughening at a macro level are effective to improve the adhesion strength to the molding resin.

Consequently, it may be employed that the surface of a metal plate surface-roughened by a dimpling process of forming dimples on the surface of the metal plate is joined to the foregoing molding resin.

The surface-roughening of the metal plate may be carried out by a method for removing some parts of the material of the metal plate, a method for sticking a foreign substance to the metal plate, a method for plastically deforming the metal plate, or the like. More particularly, it can be carried out by etching, chemical polishing, a method for sticking particles such as whisker-like plating to the surface of the metal plate, a sand blast method, a method for transferring the uneven surface of a die, or the like.

Further, in case of plating the copper plate 51 as the metal plate, it is effective to carry out partial plating on the joining face of the metal plate to the electrodes of the semiconductor chip and on the joining face of the metal plate to the lead terminals but not on the entire surface of the metal plate. This is because if plating is carried out on the joining face of the metal plate to the molding resin, the metal plate surface is smoothed to decrease the adhesion strength to the molding resin. That is, the foregoing metal plate is joined to the foregoing electrodes and the foregoing lead terminals through the partial plating formed on the foregoing metal plate and the foregoing molding resin is joined to the material of the foregoing metal plate.

Figure 4A:
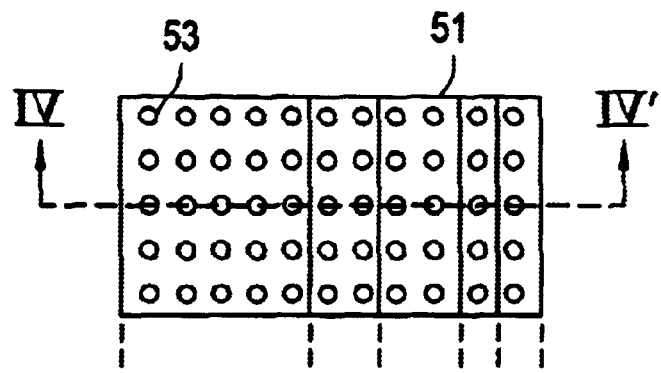
FIGS. 4A to 4C are illustrations showing the copper plate 51 (example 1) to be employed for the semiconductor device 3 of the embodiment 1 of the present invention.
Figure 4B:
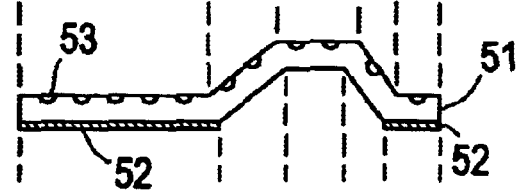
Figure 4C:
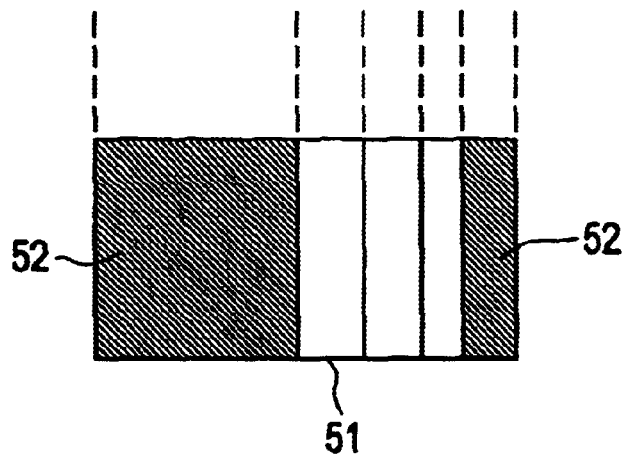

More details on these features will be described with reference to FIGS. 4A to 4C, FIGS. 5A to 5C, FIGS. 6A to 6C, and FIGS. 7A to 7C. FIGS. 4A to 4C are illustrations of the copper plate 51 (example 1) to be employed for the embodiment 1 of the semiconductor device 3 of the present invention. FIG. 4A is the illustration of the upper face, FIG. 4B is a cross-section cut along the line IV–IV' in FIG. 4A, and FIG. 4C is the illustration of the bottom face.

Figure 11A:
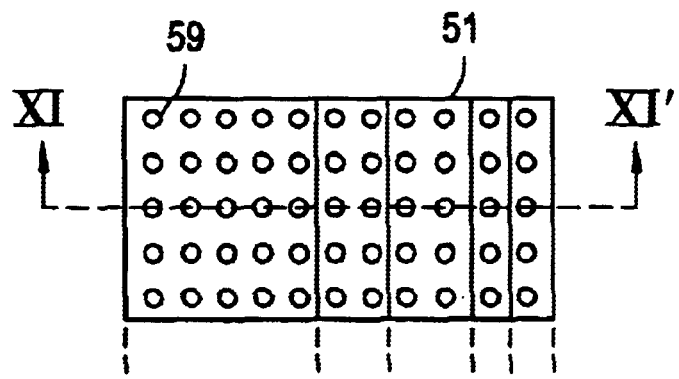
FIGS. 11A to 11C are illustrations showing the copper plate 51 (example 1) to be employed for the semiconductor device 3 of the embodiment 1 of the present invention.
Figure 11B:
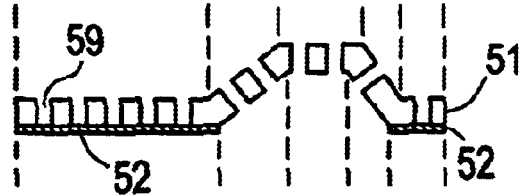
Figure 11C:
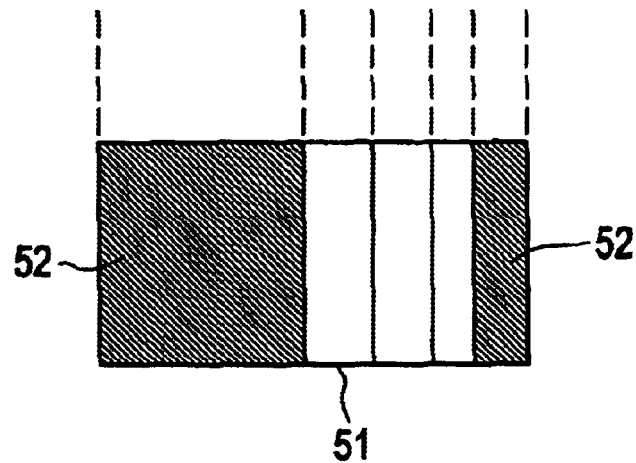

As illustrated in FIGS. 4A and 4B, the copper plate 51 has dimples 53 in the upper face The dimples 53 are those formed in the copper plate 51 and can be formed by etching and pressing. In the case of forming them by etching, they are formed by half etching, which is incompletely carried out etching. In the case where etching is completely carried out, the amount of copper removed is increased and the resistance value of the copper plate 51 is increased. In the case where the copper plate 51 has nothing to do with the resistance value, etching may completely be carried out and through holes may be formed instead of the dimples 53. That is because the adhesion strength to the molding resin 8 can be improved by through holes. The copper plate 51 having through holes 59 is shown in FIGS. 11A to 11C. Through holes 59 are formed instead of the dimples 53 of FIGS. 4A and 4B.

Further, the bottom face of the copper plate 51 is formed with silver plating 52. The silver plating 52 is for preventing oxidation of the copper plate 51, maintaining the conductivity, and lowering the contact resistance between the source electrode 32 and the source terminal 66. As illustrated in FIGS. 4B and 4C, the silver plating 52 is not carried out on the whole surface of the bottom of the copper plate 51 but on the joining faces to the source electrode 32 and to the source terminal 66. On the other hand, no silver plating is carried out on the upper face of the copper plate 51.

The silver plating is preferably carried out only on the joining parts of the copper plate 51 to the source electrode 32 and the source terminal 66. Further, it is preferable that no silver plating is carried out on the copper plate 51 other than the joining parts of the copper plate 51 to the source electrode 32 and the source terminal 66. In such a manner, the adhesion strength of the copper plate 51 and the molding resin 8 is improved and as a result, the reliability of the semiconductor device can further be improved.

Further, the silver plating may be carried out on the joining part of the source terminal 66 to the copper plate 51. The oxidation preventive effect of the copper plate 51 can further be improved by plating the source terminal 66 with silver in such a manner.

By sealing the copper plate 51 having the above described structure with a resin in the state as shown in FIGS. 3A and 3B, some of the molding resin 8 fills the dimples 53 and is hardened, so that the adhesion strength of the copper plate 51 and the molding resin 8 is improved and the reliability of the semiconductor device 3 is improved.

Figure 5A:
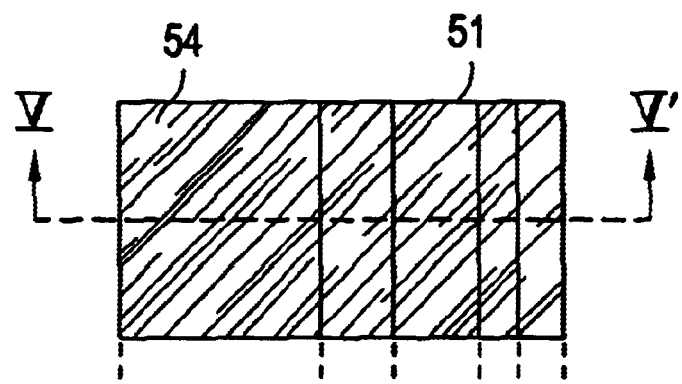
FIGS. 5A to 5C are illustrations showing the copper plate 51 (example 2) to be employed for the semiconductor device 3 of the embodiment 1 of the present invention.
Figure 5B:
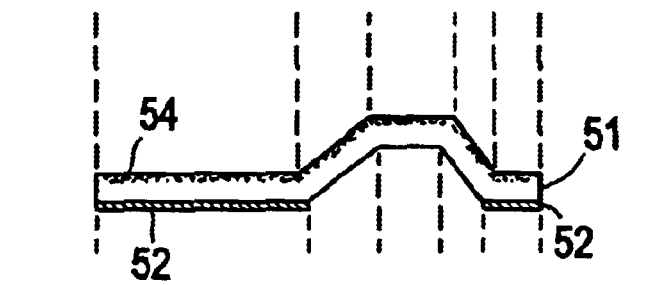
Figure 5C:
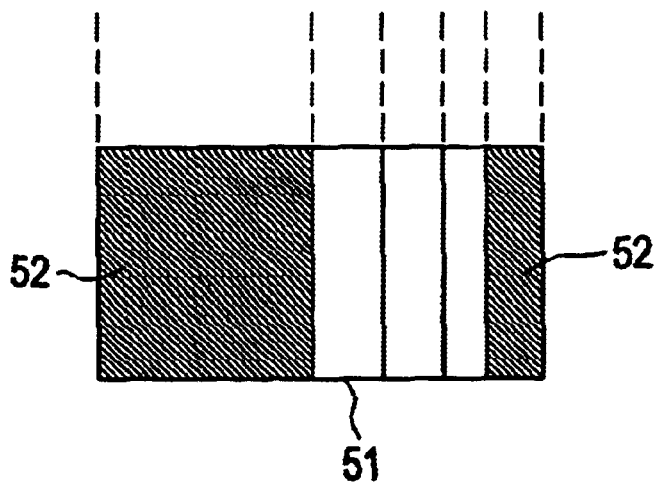

The structures as illustrated in FIGS. 5A to 5C and FIGS. 6A to 6C may be employed as the structure of the surface-roughened copper plate 51. FIGS. 5A to 5C show a copper plate 51 (example 2) to be employed for the embodiment 1 of the semiconductor device 3 of the present invention. FIG. 5A is the illustration of the upper face, FIG. 5B is a cross-section cut along the line V–V' in FIG. 5A, and FIG. 5C is the illustration of the bottom face.

As illustrated in FIGS. 5A and 5B, the copper plate 51 is roughened in the upper face by a sand blast method or a chemical polishing method. That is, the copper plate 51 has a roughened face 54 in the upper face. By sealing the copper plate 51 having the above described structure with a resin in the state as shown in FIGS. 3A and 3B, the molding resin 8 is joined to the material of the copper plate 51 and some of the molding resin 8 fills the fine recessed parts of the roughened face 54 and is hardened, so that the adhesion strength of the copper plate 51 and the molding resin 8 is improved and the reliability of the semiconductor device 3 is improved.

Further, the bottom face of the copper plate 51 is plated with silver 52. The silver plating 52 is for preventing oxidation of the copper plate 51, maintaining the conductivity, and lowering the contact resistance between the source electrode 32 and the source terminal 66. As illustrated in FIGS. 5B and 5C, the silver plating 52 is not carried out on the whole surface of the bottom of the copper plate 51 but on the joining faces to the source electrode 32 and to the source terminal 66. On the other hand, no silver plating is carried out on the upper face of the copper plate 51.

The silver plating is preferably carried out only on the joining parts of the copper plate 51 to the source electrode 32 and the source terminal 66. Further, it is preferable that no silver plating is carried out on the copper plate 51 other than the joining parts of the copper plate 51 to the source electrode 32 and the source terminal 66. In such a manner, the adhesion strength of the copper plate 51 and the molding resin 8 is improved and as a result, the reliability of the semiconductor device can further be improved.

Further, the silver plating may be carried out on the joining part of the source terminal 66 to the copper plate 51. The oxidation preventive effect of the copper plate 51 can further be improved by plating the source terminal 66 with silver in such a manner.

Figure 6A:
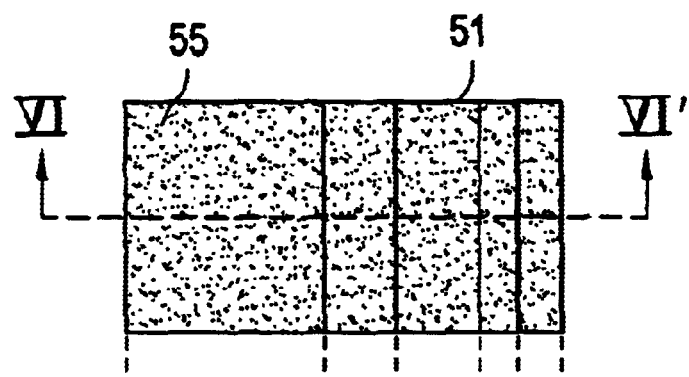
FIGS. 6A to 6C are illustrations showing the copper plate 51 (example 3) to be employed for the semiconductor device 3 of the embodiment 1 of the present invention.
Figure 6B:
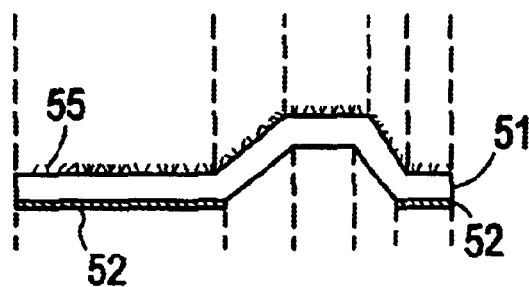
Figure 6C:
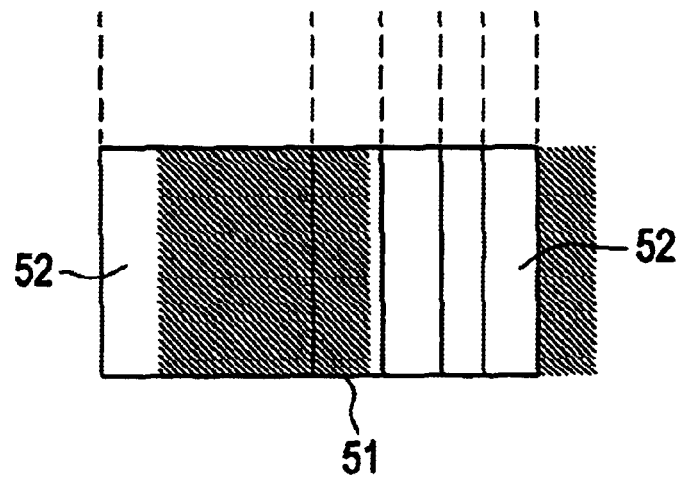

FIGS. 6A to 6C illustrate a copper plate 51 (example 3) to be employed for the embodiment 1 of a semiconductor device 3 of the present invention. FIG. 6A is the illustration of the upper face, FIG. 6B is a cross-section cut along the line VI–VI' in FIG. 6A, and FIG. 6C is the illustration of the bottom face.

As illustrated in FIGS. 6A and 6B, whisker plating 55 adheres to and is fixed on the upper face of the copper plate 51. By sealing the copper plate 51 having the above described structure with a resin in the state as shown in FIG. 3, the molding resin 8 is joined to the material of the copper plate 51 and fills even the fine surroundings of the whisker plating 55 and is hardened, so that the adhesion strength of the copper plate 51 and the molding resin 8 is improved and the reliability of the semiconductor device 3 is improved.

Further, the bottom face of the copper plate 51 is plated with silver 52. The silver plating 52 is for preventing oxidation of the copper plate 51, maintaining the conductivity, and lowering the contact resistance between the source electrode 32 and the source terminal 66. As illustrated in FIGS. 6B and 6C, the silver plating 52 is not carried out on the whole surface of the bottom of the copper plate 51 but on the joining faces to the source electrode 32 and to the source terminal 66. On the other hand, no silver plating is carried out on the upper face of the copper plate 51.

The silver plating 52 is preferably carried out only on the joining parts of the copper plate 51 to the source electrode 32 and the source terminal 66. Further, it is preferable that no silver plating is carried out on the copper plate 51 other than the joining parts of the copper plate 51 to the source electrode 32 and the source terminal 66. In such a manner, the adhesion strength of the copper plate 51 and the molding resin 8 is improved and as a result, the reliability of the semiconductor device can further be improved.

Further, the silver plating may be carried out on the joining part of the source terminal 66 to the copper plate 51. The oxidation preventive effect of the copper plate 51 can further be improved by plating the source terminal 66 with silver in such a manner.

Further, regardless of whether the above described dimples 53, roughened surface 54, and whisker plating 55 are formed or not, the molding resin 8 is joined to the material of the copper plate 51, the oxygen group on the surface of the copper plate 51 improves the adhesion strength to the molding resin 8 and the reliability of the semiconductor device 3 can be improved.

FIGS. 7A to 7C illustrate a copper plate 51 (example 4) to be employed for the embodiment 1 of a semiconductor device 3 of the present invention. FIG. 7A is the illustration of the upper face, FIG. 7B a cross-section cut along the line VII–VII' in FIG. 7A, and FIG. 7C is the illustration of the bottom face.

As illustrated in FIGS. 7B and 7C, groove parts 70 are formed in two bent parts of the copper plate 51 in the direction crossing the extended direction of the source terminal 66. These groove parts 70 can be formed by etching and press working. By forming such groove parts 70, the copper plate 51 is made easy to be bent at the time of fabricating the semiconductor device 3 and consequently the fabrication of the semiconductor device is made easy. Also, the adhesion strength between the copper plate 51 and the molding resin 8 is further improved, the closed property (sealed property) provided by the molding resin is further improved and the reliability of the semiconductor device 3 is further improved.

In FIGS. 7A to 7C, the groove parts 70 are formed in the recessed face side of the bent parts of the foregoing metal plate, the groove parts 70 may be formed in the side opposed to the recessed face side of the bent parts, in other words, in the projected face side.

Figure 8A:
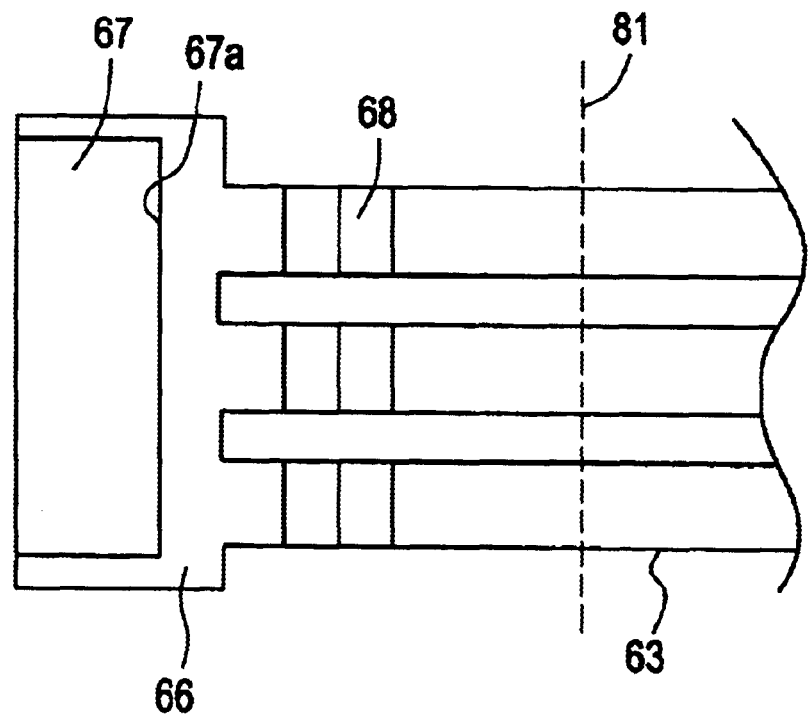
FIGS. 8A and 8B are illustrations showing the source lead 63 parts of the lead frame 60 to be employed for the semiconductor device 3 of the embodiment 1 of the present invention.
Figure 8B:
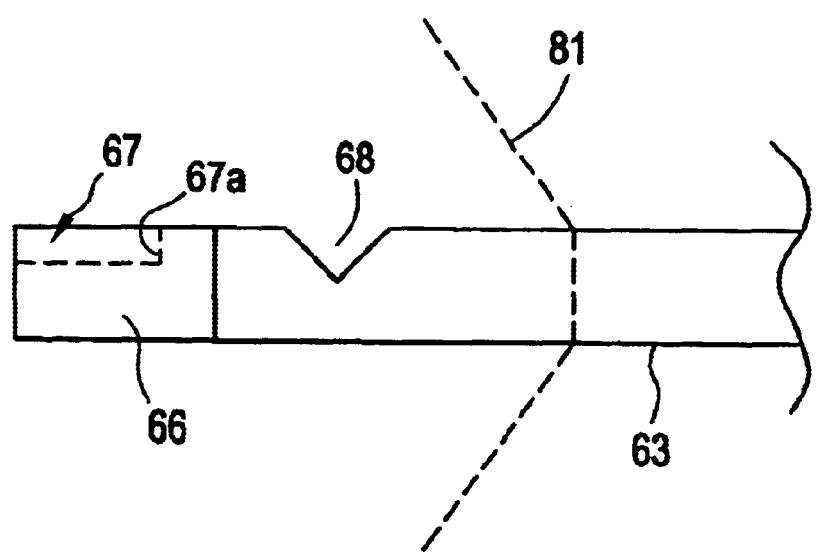

On the other hand, as illustrated in FIGS. 3A and 3B, a stepped part 67 to form a recessed part toward the copper plate 51 side and a groove part 68 are formed in the lead frame 60. That will be described with reference to FIGS. 8A and 8B. FIGS. 8A and 8B are partial illustrations of a source lead 63 part of the lead frame 60 to be employed for the embodiment 1 of a semiconductor device 3 of the present invention. FIG. 8A is the plane view and FIG. 8B is a side view.

As illustrated in FIGS. 8A and 8B, the stepped part 67 is formed in the source terminal 66. The source terminal 66 is so formed as to be wide and integrate three source leads. That is, is formed to be long in the same direction as that of the package external shape 81. As illustrated in FIGS. 8A and 8B, the stepped part 67 is a stepped part to be recessed toward the copper plate 51 side from the lead upper end in the surrounding. In the case of the observation of the source leads along the extended direction of the lead from the source terminal 66 as the base point, a rising wall face 67*a* is formed. The wall face 67*a* is parallel to the package external shape 81 and vertical to the extended direction of the source leads 63.

Further, groove parts 68 are formed in the respective three source leads 63. As illustrated in FIGS. 8A and 8B, each groove 68 is a V-shape groove parallel to the package external shape 81 and vertical to the extended direction of the source lead 63.

Since the above described stepped part and groove parts are not formed in a conventional lead frame, during a series of processes of applying a solder paste or a conductive paste is printed on or applied to the source terminal, mounting a metal plate thereon, and reflowing or curing the paste, the solder paste or the conductive paste sometimes flows toward the outside of the package on the source lead and is spread near the package external shape 81 or to the outside of the package external shape 81. Consequently, the adhesion strength of the source leads an the molding resin is deteriorated and the reliability of the semiconductor device is decreased.

However, in the semiconductor device 3 of the embodiment of the present invention, since the stepped part 67 and the groove parts 68 are formed in the lead frame 60, the solder paste or the conductive paste printed on or applied to the bottom face of the stepped part 67 is inhibited from flowing on the source leads and being spread by the stepped part 67 and the wall face 67*a*. Also, by any chance, even if the solder paste or the conductive paste flows out over the wall face 67*a*, the flow can be intercepted by the groove parts 68. As a result, the adhesion strength of the source leads 63 and the molding resin 8 is not deteriorated and the reliability of the semiconductor device is improved.

The stepped part 67 and groove parts 68 can be formed at the time of the pressing process of the lead frame. The stepped part 67 is a stepped part formed by crushing a part of the source terminal 66 at the time of the pressing process, however the stepped part may be formed by bending without crushing.

Further, instead of the stepped part 67, a groove with an approximately U-shape cross section may be formed in the same position of the stepped part 67. However, in the case of forming the groove, if a solder paste or a conductive paste overflows the groove part, the solder or conductive paste possibly flows toward the outside of the package on the source leads 63, so that it is advantageous to form the above described stepped part. That is because, in the case of forming a stepped part, there is no wall face to inhibit the flow of the solder paste or the conductive paste in the inner side of the package and hence the excess solder paste or the conductive paste flows to the inner side of the package.

The stepped parts are made to be lowered stepped parts relative to an adjacent segment of the plate. That is because if they are made to be elevated stepped parts, the wall faces formed are only wall faces seen descending by the observation along the extended direction of the lead from the lead terminals from the base points. Such descending wall faces cannot inhibit the flow of the conductive joining material on the lead.

Further, since some of the molding resin 8 fills the groove parts 68 and is cured in the groove parts 68, the adhesion strength of the lead frame 60 and the molding resin 8 is improved by the groove parts 68 formed in the lead frame. Therefore, as illustrated in FIGS. 3A and 3B, groove parts 68 are formed in the drain leads 61 and the gate lead 62 the inner side near the package terminal face.

EMBODIMENT 2

Figure 9A:
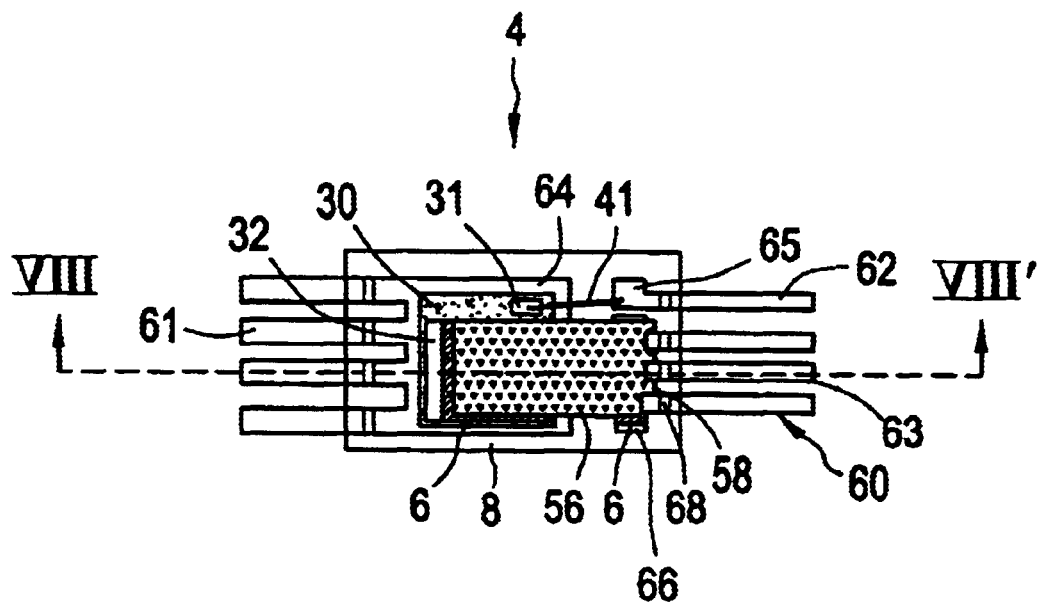
FIGS. 9A and 9B are illustrations showing the semiconductor device 4 of the embodiment 2 of the present invention.
Figure 9B:
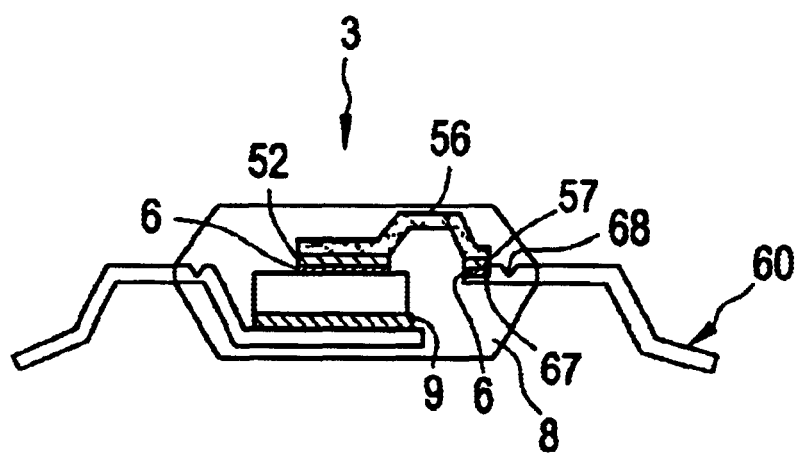
Figure 10A:
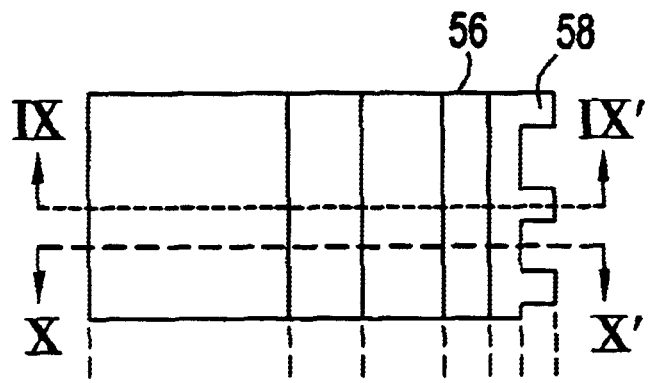
FIGS. 10A to 10D are illustrations showing the copper plate 56 to be employed for the semiconductor device 4 of the embodiment 2 of the present invention.
Figure 10B:
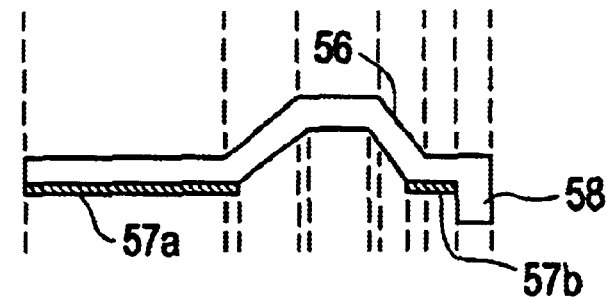
Figure 10C:
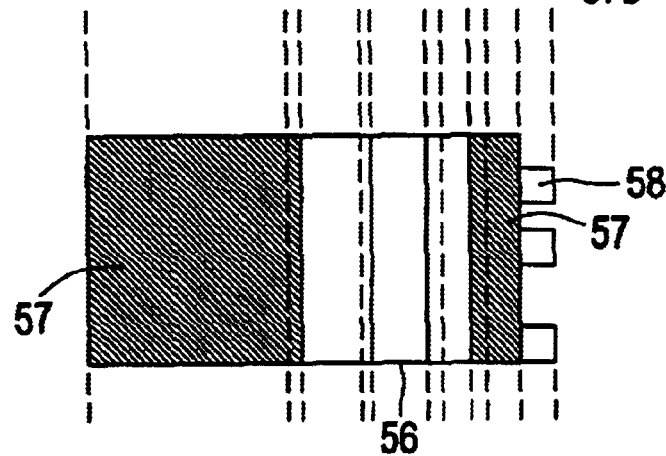
Figure 10D:
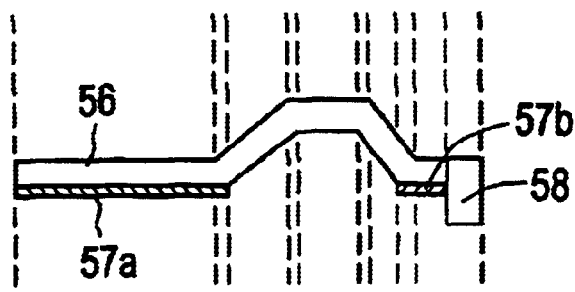

Next, an embodiment 2 of a semiconductor device 4 of the present invention will be described with reference to FIGS. 9A and 9B and FIGS. 10A to 10C. FIGS. 9A and 9B are illustrations showing the semiconductor device 4 of the embodiment 2 of the present invention and FIG. 9A is a plane view and FIG. 9B is a cross-section cut along the VIII–VIII' line in FIG. 9A. FIGS. 10A to 10C are illustrations showing a copper plate 56 to be employed for the semiconductor device 4 of the embodiment 2 of the present invention. FIG. 10A is a plane view, FIG. 10B is a cross-section cut along the IX–IX' line in FIG. 10A, and FIG. 10C is the bottom FIG.

The semiconductor device 4 of the embodiment 2 has the same constitution as that of the semiconductor device 3 of the embodiment 1. However, it is different in the point that claw parts 58 are formed in the copper plate 56.

Similar to the copper plate 51 in the embodiment 1, the copper plate 56 is plated with silver plating 57a, 57b. As illustrated in FIGS. 10B and 10C, the silver plating 57a, 57b is not carried out on the entire bottom face of the copper plate 56 but the silver plating 57a is carried on the joining face to the source electrode 32 and the silver plating 57b is carried out on the joining face of the source terminal 66. On the other hand, no silver plating is carried out on the upper face of the copper plate 56.

Although the copper plate 56 has the same shape as that of the copper plate 51 of the embodiment 1, three claw parts 58 are extended in the end part of the copper plate 56 in the source lead 63 side. As illustrated in FIG. 9B, the three claw parts 58 are formed by bending the copper plate 56 toward the bottom face and protruded beyond the face plated with silver 57b. In FIGS. 9A and 9B, the second and the third claw parts 58 from the top are fitted in the intervals of the three source leads 63. In FIGS. 9A and 9B, the first claw part 58 from the top is fitted in the interval between the gate lead 62 and the source lead 63 but is not brought into contact with the gate lead 62 and isolated from the gate lead 62 and together with other claw parts 58, the first claw part 58 is fitted in the source lead 63.

These claw parts 58 can be formed at the time of pressing process of the copper plate 56.

Attributed to the formation of the above described claw parts 58, the copper plate 56 can be positioned at high precision on the source electrode 32 and the source terminal 66 of a semiconductor chip 30 by inserting the claw parts 58 among leads and fitting in the source leads 63 at the time of mounting the copper plate 56. It is preferable to form two or more claw parts. If there is only one, engagement among the leads is carried out only at one point. Consequently, rotation of the metal plate around the claw part as a supporting point may occur, resulting in a positioning difference of the metal plate.

Hereinafter, examples of copper plates with the surface average roughness Ra will be disclosed.

The surface of a copper plate without being subjected to surface-roughening had an average surface roughness of 0.1 $\mu$m Ra.

The surface of a copper plate subjected to surface-roughening by chemical polishing (chemical solution treatment) had an average surface roughness of 0.2 to 0.3 $\mu$m Ra. The surface of a copper plate subjected to surface-roughening by a sand blast method had an average surface roughness of 0.3 to 0.4 $\mu$m Ra. The surface of a copper plate subjected to surface-roughening by whisker-like plating had an average surface roughness of 0.3 to 0.4 $\mu$m Ra.

As described above, the present invention is effective to improve the adhesion strength of a metal plate and a molding resin since the molding resin is joined to the surface of a surface roughened metal plate and also effective to prevent flow out of a conductive joining material since a stepped part to be recessed toward the metal plate side is formed in the lead terminal part to be coated with the joining material and as a result, the present invention is effective to improve the adhesion strength of the molding resin and the closed property (sealed property) provided by the molding resin, to prevent the penetration of the semiconductor chip with water, a gas, or the like and to improve the reliability of the semiconductor device.

Further, the present invention is effective to mount a metal plate on electrodes of the semiconductor chip and the lead terminals of the lead frame easily at high precision attributed to the structure in which the claw parts formed in the metal plate are fitted in the lead frame.

The present invention is not limited to the above embodiments, and it is contemplated that numerous modifications may be made without departing from the spirit and scope of the invention. The semiconductor device, as described above with reference to the FIGS., is a merely an exemplary embodiment of the invention, and the scope of the invention is not limited to these particular embodiments. Accordingly, other structural configurations may be used, without departing from the spirit and scope of the invention as defined in the following claims.

What is claimed:

1. A semiconductor device comprising:
   a semiconductor chip having a plurality of electrodes;
   wiring materials having a plurality of lead terminals;

a metal plate connecting with said plurality of electrodes at a first portion of said metal plate and connecting with said plurality of lead terminals at a second portion of said metal plate;
a molding resin sealing said semiconductor chip, parts of said wiring materials, and said metal plate, wherein
a surface of said metal plate is uneven and joined to said molding resin;
wherein said metal plate connects with said plurality of electrodes and said plurality of lead terminals by a plating formed on said metal plate;
wherein said metal plate has at least one bent part between said first portion and said second portion; and
wherein said plating is formed only on said first portion and said second portion.

2. The semiconductor device as claimed in claim 1 wherein said metal plate has a groove formed at said bent part in a direction crossing a direction of said lead terminals.

3. The semiconductor device as claimed in claim 2 wherein said groove is formed in a recessed face side of said bent part of said metal plate.

4. A semiconductor device comprising:
a semiconductor chip having a plurality of electrodes;
wiring materials having a plurality of lead terminals elongated in a first direction;
a metal plate having a first main surface and a second main surface opposed to said first main surface, wherein said metal plate is joined to said plurality of electrodes at a first end portion of said first main surface and is joined to said plurality of lead terminals at a second end portion of said first main surface facing to said first end portion to connect said plurality of electrodes and said plurality of lead terminals; and
a molding resin sealing said semiconductor chip, parts of said wiring materials, and said metal plate, wherein
said second main surface of said metal plate is roughened, said second main surface having a plurality of recesses filled with said molding resin,
wherein said metal plate connects with said plurality of electrodes and said plurality of lead terminals by a plating formed on said first main surface,
wherein said metal plate has at least one bent part elongated in a second direction crossing said first direction between said first end portion and said second end portion,
wherein said plating is formed on said first end portion and said second end portion,
wherein said plurality of lead terminals have a stepped part,
wherein said metal plate are connected with said stepped part by a conductive bonding material, and
wherein said metal hole has at least one through hole.

5. A semiconductor device comprising:
a semiconductor chip having a plurality of electrodes;
wiring materials having a plurality of lead terminals;
a metal plate connecting with said plurality of electrodes at a first portion of said metal plate and connecting with said plurality of lead terminals at a second portion of said metal plate;
a molding resin sealing said semiconductor chip, parts of said wiring materials, and said metal plate, wherein
a surface of said metal plate is uneven and joined to said molding resin;
wherein said plurality of lead terminals have a stepped part; and wherein said metal plate is connected with said stepped part by a conductive bonding material; and
wherein said surface of said metal plate has a plurality of whisker platings.

6. A semiconductor device comprising:
a semiconductor chip having a plurality of electrodes;
wiring materials having a plurality of lead terminals elongated in a first direction;
a metal plate having a first main surface and a second main surface opposed to said first main surface, wherein said metal plate is joined to said plurality of electrodes at a first end portion of said first main surface and is joined to said plurality of lead terminals at a second end portion of said first main surface facing to said first end portion to connect said plurality of electrodes and said plurality of lead terminals; and
a molding resin sealing said semiconductor chip, parts of said wiring materials, and said metal plate, wherein
said second main surface of said metal plate is roughened, said second main surface having a plurality of recesses filled with said molding resin,
wherein said metal plate connects with said plurality of electrodes and said plurality of lead terminals by a plating formed on said first main surface,
wherein said metal plate has at least one bent part elongated in a second direction crossing said first direction between said first end portion and said second end portion,
wherein said plating is formed on said first end portion and said second end portion,
wherein said metal plate has claw parts being extended from an edge part of said metal plate and being fitted in intervals of two of said wiring materials, and
wherein said metal plate has at least one through hole.

7. A semiconductor device comprising:
a semiconductor chip having a plurality of electrodes;
wiring materials having a plurality of lead terminals;
a metal plate connecting with said plurality of electrodes at a first portion of said metal plate and connecting with said plurality of lead terminals at a second portion of said metal plate;
a molding resin sealing said semiconductor chip, parts of said wiring materials, and said metal plate, wherein
a surface of said metal plate is uneven and joined to said molding resin;
wherein said metal plate has claw parts fitted in said wiring materials; and
wherein said surface of said metal plate has a plurality of whisker platings.

8. The semiconductor device, comprising:
a semiconductor chip having at least one electrode;
a lead terminal arranged at a distance from said semiconductor chip;
a metal plate having a first main surface and a second main surface opposed to said first main surface, said first main surface having a first end portion connected to said at least one electrode and a second end portion connected to said lead terminal; and
a molding resin encapsulating said semiconductor chip, said lead terminal and said metal plate;
wherein said second main surface has a roughened surface which enhances adhesion strength between said metal plate and said molding resin and no connection with any electrode.

9. The device as claimed in claim 8, wherein said surface of said metal plate is dimpled to enhance the adhesion strength between said metal plate and said molding resin.

10. A semiconductor device, comprising:

a semiconductor chip having at least one electrode;

a lead terminal arranged at a distance from said semiconductor chip;

a metal plate connected at a first end portion thereof to said at least one electrode of said semiconductor chip and at a second end portion thereof to said lead terminal; and a molding resin encapsulating said semiconductor chip, said lead terminal and said metal plate;

said metal plate having a surface which is subject to such a treatment that enhances adhesion strength between said metal plate and said molding resin, wherein a plurality of through holes are provided in said metal plate to enhance the adhesion strength between said metal plate and said molding resin.

11. A semiconductor device, comprising:

a semiconductor chip having at least one electrode;

a lead terminal arranged at a distance from said semiconductor chip;

a metal plate connected at a first end portion thereof to said at least one electrode of said semiconductor chip and at a second end portion thereof to said lead terminal; and a molding resin encapsulating said semiconductor chip, said lead terminal and said metal plate;

said metal plate having a surface which is subject to such a treatment that enhances adhesion strength between said metal plate and said molding resin, wherein said surface of said metal plate is subject to whicker plating to enhance the adhesion strength between said metal plate and said molding resin.

12. The semiconductor device as claimed in claim 8, wherein an average roughness is 0.1 to 0.4 $\mu$mRa.

13. A semiconductor device, comprising:

a semiconductor ship having a plurality of electrodes;

a wiring having a lead terminal;

a metal plane connecting with at least one of said electrodes at a first portion of said metal plate and connecting with said lead terminal at a second portion of said metal plate;

a molding resin sealing said semiconductor chip, a part of said wiring, and said metal plate, wherein a surface of said metal plate is uneven and joined to said molding resin;

wherein said metal plane connects with said at least one of said electrodes and said lead terminal by a plating formed on said metal plate;

wherein said metal plate has at least one bent part between said first portion and second portion; and wherein said plating is formed only on said first portion and second portion.

* * * * *